United States Patent
Lee et al.

(10) Patent No.: US 9,429,701 B2
(45) Date of Patent: Aug. 30, 2016

(54) LIGHT EMITTING DIODE ASSEMBLY AND LIQUID CRYSTAL DISPLAY DEVICE INCLUDING THE SAME

(71) Applicant: LG DISPLAY CO., LTD., Seoul (KR)

(72) Inventors: Rok-Hee Lee, Seoul (KR); Jae-Min Sim, Jeongeup-si (KR); Do-Man Kim, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 249 days.

(21) Appl. No.: 14/144,160

(22) Filed: Dec. 30, 2013

(65) Prior Publication Data

US 2015/0062484 A1  Mar. 5, 2015

(30) Foreign Application Priority Data

Aug. 30, 2013 (KR) .................. 10-2013-0103708

(51) Int. Cl.
| | | |
|---|---|---|
| G02F 1/1335 | (2006.01) | |
| F21V 8/00 | (2006.01) | |
| H01L 25/075 | (2006.01) | |
| H01L 33/50 | (2010.01) | |

(52) U.S. Cl.
CPC ............ *G02B 6/0073* (2013.01); *G02B 6/0023* (2013.01); *G02B 6/0083* (2013.01); *H01L 25/0753* (2013.01); *H01L 33/50* (2013.01); *H01L 2224/48091* (2013.01)

(58) Field of Classification Search
None
See application file for complete search history.

(56) References Cited

U.S. PATENT DOCUMENTS

| | | | | |
|---|---|---|---|---|
| 5,608,553 | A * | 3/1997 | Kim ................. | G02F 1/133603 349/61 |
| 6,433,767 | B1* | 8/2002 | Murade .............. | G02F 1/13454 345/87 |
| 2008/0116466 | A1* | 5/2008 | Chen ................. | H01L 25/0753 257/88 |
| 2010/0079697 | A1 | 4/2010 | Park et al. | |
| 2010/0225849 | A1* | 9/2010 | Takeuchi ............ | G02B 6/0023 349/62 |
| 2014/0036205 | A1* | 2/2014 | Sugiura ............. | G02F 1/133615 349/69 |
| 2014/0346536 | A1* | 11/2014 | Sugiura ............. | G02F 1/1335 257/88 |
| 2014/0367633 | A1* | 12/2014 | Bibl ................. | H01L 24/95 257/13 |

FOREIGN PATENT DOCUMENTS

| | | |
|---|---|---|
| CN | 101684908 A | 3/2010 |
| CN | 102620197 A | 8/2012 |
| JP | 2008-186914 A | 8/2008 |
| JP | 2008-244165 | * 10/2008 |
| JP | 2011-061056 | * 3/2011 |
| JP | WO 2012/144126 | * 10/2012 |
| KR | 10-2012-0034389 A | 4/2012 |

* cited by examiner

Primary Examiner — Ryan Crockett
(74) Attorney, Agent, or Firm — Birch, Stewart, Kolasch & Birch, LLP

(57) ABSTRACT

A liquid crystal display device includes a liquid crystal panel; and a backlight unit disposed under the liquid crystal panel and including an LED assembly, wherein the LED assembly includes a frame portion, LED chips arranged in the frame portion in a line and spaced apart from each other, connecting portions each disposed between adjacent LED chips and connected to adjacent LED chips through wire bonding, and a sealing portion including a fluorescent substance and covering the LED chips and the connecting portions, and wherein the sealing portion changes light emitted from the LED chips into a linear light source.

9 Claims, 5 Drawing Sheets

LIGHT EMITTING DIODE ASSEMBLY AND LIQUID CRYSTAL DISPLAY DEVICE INCLUDING THE SAME

The present application claims the priority benefit of Korean Patent Application No. 10-2013-0103708 filed in the Republic of Korea on Aug. 30, 2013, which is hereby incorporated by reference in their entirety.

BACKGROUND

1. Field of the Disclosure

The present disclosure relates to a light emitting diode assembly and a liquid crystal display device including the same, and more particularly, to a light emitting diode (LED) assembly and a liquid crystal display (LCD) device including the same that improve heat-discharging properties and have a narrow bezel and a slim thickness.

2. Discussion of the Related Art

Liquid crystal display (LCD) devices are widely used as monitors of notebook computers, monitors of personal computers and televisions due to excellent reproduction of moving images and high contrast ratio. LCD devices use the optical anisotropy and polarization properties of liquid crystal molecules of a liquid crystal layer to produce an image.

An LCD device includes two substrates spaced apart from each other and facing each other as well as a liquid crystal layer interposed between the two substrates. The alignment direction of the liquid crystal molecules is controlled by varying the intensity of an electric field applied to the liquid crystal layer, and changing the transmittance of light through the liquid crystal layer.

The LCD devices require an additional light source because the LCD devices are not self-luminescent. Therefore, a backlight unit is disposed at a rear side of a liquid crystal (LC) panel and emits light into the LC panel to display images.

Backlight units are in general classified as edge type or direct type according to the position of the light source with respect to an LC panel. In edge-type backlight units, a light guide plate is disposed under the LC panel, and one or a pair of lamps are disposed at one side or at each of two sides of the light guide plate. Light from the lamps is refracted and reflected by the light guide plate to be indirectly provided to the LC panel. In direct-type backlight units, a plurality of lamps is disposed directly under the LC panel, and light from the lamps is directly provided to the LC panel.

Backlight units include cold cathode fluorescent lamps (CCFLs), external electrode fluorescent lamps (EEFLs), and light emitting diodes (LEDs) as a light source. Among these, LEDs have been widely used due to their small sizes, low power consumption, and high reliability.

The LEDs are mounted on a printed circuit board and spaced apart from each other, thereby forming an LED assembly.

Recently, LCD devices have been widely used for display devices and have been required to have high brightness in addition to light weight, a thin thickness and a narrow bezel.

At this time, the LCD device may have high brightness by increasing the number of LEDs. However, since a length of the printed circuit board and a distance between the LEDs are fixed, there is a restriction on an increase of the LEDs.

In addition, the number of LEDs should increase minimizing the distance between the LEDs in the fixed area, and thus heat generated from the LEDs increases. Accordingly, when the heat is not properly discharged, there may be problems of degrading the LEDs, lowering the light efficiency and shortening the lifetime of the LEDs.

SUMMARY OF THE INVENTION

Accordingly, the present invention is directed to an LED assembly and a liquid crystal display device including the same, which substantially obviate one or more of the problems due to limitations and disadvantages of the related art.

An object of the present disclosure is to provide an LED assembly that enables a liquid crystal display device to have relatively a thin thickness, a narrow bezel and high brightness.

Another object of the present disclosure is to provide an LED assembly and a liquid crystal display device including the same that increase heat-discharging properties to prevent light efficiency and lifetime of LED chips from being lowered.

Another object of the present disclosure is to provide an LED assembly and a liquid crystal display device including the same that minimize bonding problems, simplify manufacturing processes and reduce manufacturing costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a liquid crystal display device includes a liquid crystal panel; and a backlight unit disposed under the liquid crystal panel and including an LED assembly, wherein the LED assembly includes a frame portion, LED chips arranged in the frame portion in a line and spaced apart from each other, connecting portions each disposed between adjacent LED chips and connected to adjacent LED chips through wire bonding, and a sealing portion including a fluorescent substance and covering the LED chips and the connecting portions, and wherein the sealing portion changes light emitted from the LED chips into a linear light source.

In another aspect, an LED assembly includes a frame portion; LED chips arranged in the frame portion in a line and spaced apart from each other; connecting portions each disposed between adjacent LED chips and connected to adjacent LED chips through wire bonding; and a sealing portion including a fluorescent substance and covering the LED chips and the connecting portions, wherein the sealing portion changes light emitted from the LED chips into a linear light source.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
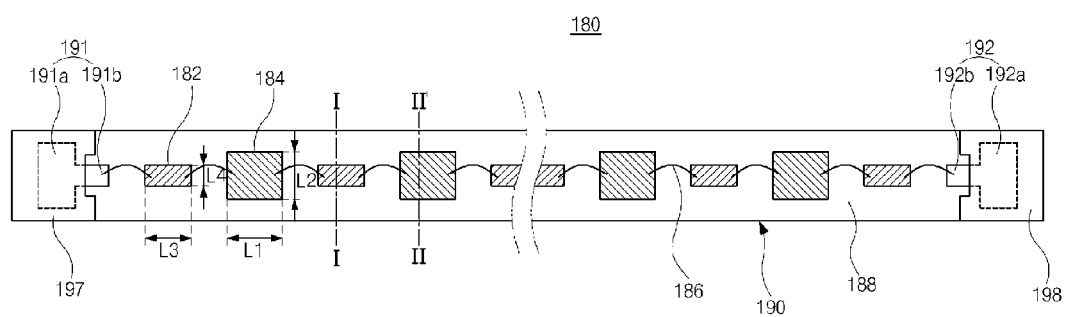
FIG. 1 is a plan view of illustrating an LED assembly according to an exemplary embodiment of the present invention.
Figure 2:
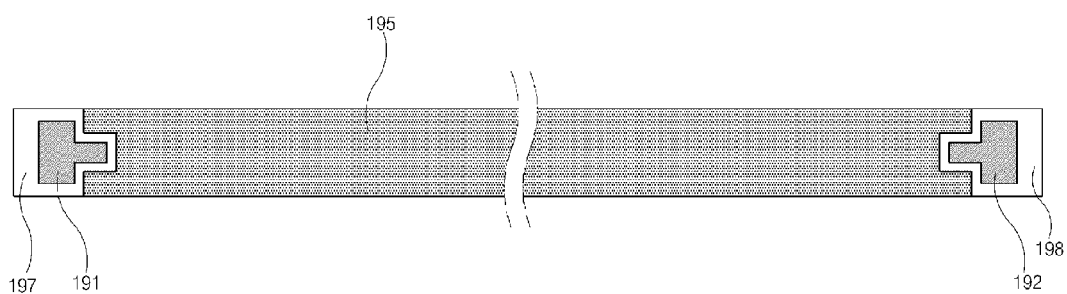
FIG. 2 is a rear view of illustrating the LED assembly of FIG. 1.
Figure 3:
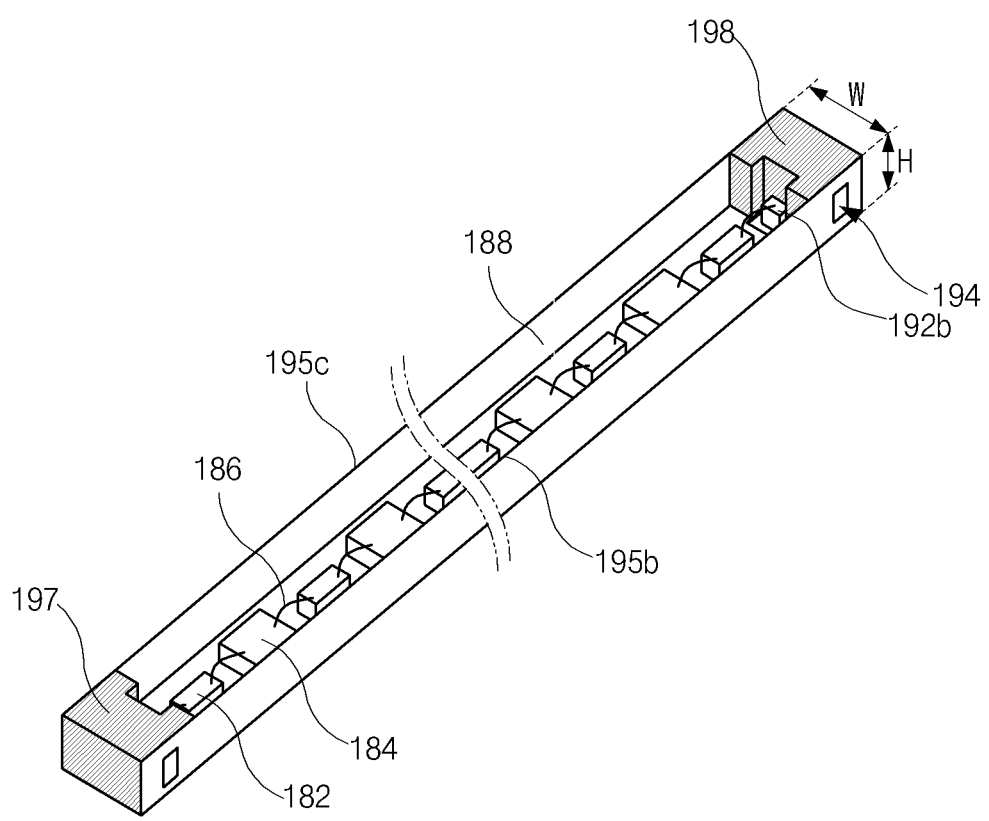
FIG. 3 is a perspective view of illustrating the LED assembly of FIG. 1.

FIG. 1 is a plan view of illustrating an LED assembly according to an exemplary embodiment of the present invention, FIG. 2 is a rear view of illustrating the LED assembly of FIG. 1, and FIG. 3 is a perspective view of illustrating the LED assembly of FIG. 1.

In FIG. 1, FIG. 2 and FIG. 3, the LED assembly 180 includes LED chips 182 emitting light, connecting portions 184 for connection between the LED chips 182, wires 186 electrically connecting the LED chips 182 and the connecting portions 184, a sealing portion 188 sealing the LED chips 182 and the connecting portions 184, and a frame portion 190 surrounding the LED chips 182, the connecting portions 184, the wires 186 and the seal portion 188 to form one united body.

The LED chips 182 are arranged in the frame portion 190 along a length direction of the frame portion 190 in a line. The LED chips 182 are connected by the connecting portions 184 and the wires 186 in series.

The connecting portions 184, each of which have a predetermined size, are components for bonding the wires 186 without problems and arranged alternatively with the LED chips 182 such that one connecting portion 184 is disposed between adjacent LED chips 182 as an island shape. Here, the problems means sagging of the wires 184 connected to adjacent LED chips 182 and disconnection or electrical shortage during wire bonding.

The connecting portions 184 will be described in detail with reference to FIG. 1. First, the length direction of the frame portion 190 is defined as a first direction, and a direction perpendicular to the first direction is defined as a second direction.

The connecting portions 184 each have a first length L1 along the first direction and a second length L2 along the second direction. The LED chips 182 each have a third length L3 along the first direction and a fourth length L4 along the second direction.

The first length L1 and the second length L2 of the connecting portions 184 are longer than the third length L3 and the fourth length L4 of the LED chips 182, and the connecting portions 184 are larger than the LED chips 182. Thus, the connecting portions 184 have large areas for wire bonding, and wire bonding can be easily achieved.

Meanwhile, the size of the connecting portions 184 may be changed. That is, the first length L1 and the second length L2 of the connecting portions 184 may be equal to the third length L3 and the fourth length L4 of the LED chips 182, respectively, and the first length L1 and the second length L2 of the connecting portions 184 may be shorter than the third length L3 and the fourth length L4 of the LED chips 182. At this time, when the first length L1 is shortened, the distance between the LED chips 182 may be decreased, and the number of the LED chips 182 may be increased. When the second length L2 is shortened, a width W of the frame portion 190 along the second direction may be narrowed.

Here, the number of the connecting portions 184, beneficially, may be one less than the number of the LED chips 182 because each of the connecting portions 184 is formed between adjacent LED chips 182.

Meanwhile, when the connecting portions 184 are not used, the LED chips 182 may be connected by a chip to chip bonding method in series. For example, one end of a wire 186 is connected to a first bonding position (for example, a cathode) of a first LED chip 182, and the other end of the wire 186 is connected to a second bonding position (for example, an anode) of a second LED chip 182. However, since the limited areas of the LED chips 182, for example, the anode and cathode, are used as the bonding positions for the wire 186, if the number of the LED chips 182 increases, the error range is accumulated. Thus, it is difficult to accurately find the bonding positions of the LED chips 182 and to exactly bond the LED chips 182 and the wires 186. In addition, the LED chips 182 adjacent to each other may be directly connected to each other through wire bonding, and the wires 186 may sag. This will cause electrical shortage of the wires 186. As stated above, the chip to chip bonding method may be main reasons causing bonding contact problems such as disconnection or electrical shortage of the wires 186.

On the other hand, in the present invention, the wires 186 are bonded using the connecting portions 184 having an island shape and larger sizes than the limited areas of the LED chips 182, and the wires 186 are accurately bonded at the bonding positions. Therefore, the wires 186 are prevented from being electrical shortage due to sagging of the wires 186, and the bonding contact problems are prevented. For example, one end of the wire 184 is connected to the first bonding position of the first LED chip 182, and the other end of the wire 184 is connected to the first connecting portion 184.

The sealing portion 188 is formed by applying silicone resin or epoxy resin including a fluorescent substance onto the LED chips 182 and the connecting portions 184 and curing the resin.

The sealing portion 188 covers the LED chips 182 all over and changes a point light source of the LED chips 182 into a linear light source of a bar shape.

Although not shown in the figures, the sealing portion 188 may have a double-layered structure. In this case, a first layer of the sealing portion 188 may be formed by coating the LED chips 182 and the connecting portions 184 with a fluorescent substance, and a second layer of the sealing portion 188 may be formed by applying silicone resin or epoxy resin onto the first layer and then curing the resin.

The frame portion 190 may be formed of a metallic material. The frame portion 190 covers and protects the LED chips 182, the connecting portions 184 and the sealing portion 188 and also efficiently discharges heat generated from the LED chips 182.

The frame portion 190 may includes first and second molding parts 197 and 198 and a metal part 195. The first and second molding parts 197 and 198 are formed of an insulating material and are disposed at both ends of the metal part 195. The metal part 195 is formed of a metallic material and is disposed between the first and second molding parts 197 and 198.

Here, a first electrode pad part 191 is formed in the first molding part 197 and is electrically connected to a first terminal of an external power supply (not shown). A second electrode pad part 192 is formed in the second molding part 198 and is electrically connected to a second terminal of the external power supply (not shown). Each of the LED chips 182a 182 is supplied with voltages through the first electrode pad part 191 and the second electrode pad part 192 and emits light.

Each of the first electrode pad part 191 and the second electrode pad part 192 includes a first part 191a and 192a connected to the external power supply (not shown) and a second part 191b and 192b connected to the LED chips 182 through wire bonding. The second parts 191b and 192b of the first and second electrode pad parts 191 and 192 are exposed outside the first and second molding parts 197 and 198, respectively, to be electrically connected to the LED chips 182 through the wires 186.

In the meantime, when the LED assembly is viewed from the bottom side, as shown in FIG. 2, the first and second electrode pad parts 191 and 192 are exposed to the outside.

The metal part 195 may be formed of a metallic material having relatively high heat conductivity such as aluminum, copper, iron or their combination including at least two materials and may promptly discharge heat generated from the LED chips 182 to the outside.

Figure 4A:
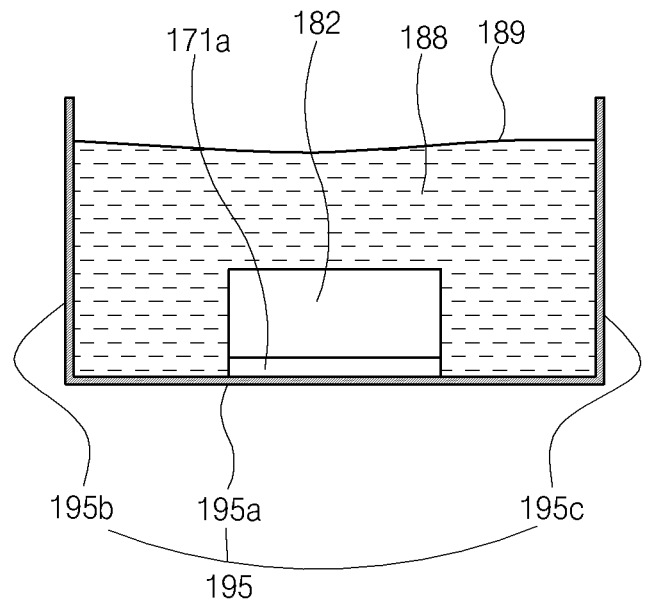
FIG. 4A is a cross-sectional view taken along the line I-I' of FIG. 1.

At this time, the metal part 195 includes a bottom part 195a of FIG. 4A, and first and second side parts 195b and 195c. The LED chips 182 and the connecting portions 184 are mounted on the bottom part 195a of FIG. 4A. The first and second side parts 195b and 195c are perpendicularly connected to both ends of the bottom part 195a of FIG. 4A along a length direction of the bottom part 195a of FIG. 4A and face each other.

Complementary grooves 194 may be further formed at an outer surface of the first side part 195b corresponding to the first and second molding parts 197 and 198, respectively. The complementary grooves 194 may be formed together during injection molding of the LED assembly 180, that is, the frame portion 190 including the first and second molding parts 197 and 198 and the metal part. The complementary grooves 194 provide toughness to the frame portion 190 such that the LED assembly 180 is prevented from being deformed by outer physical force.

The complementary grooves 194 may be formed at both ends of the first side part 195b, respectively or may be formed at both ends of the first and second side parts 195b and 195c.

As stated above, in the LED assembly 180 of the present invention, the LED chips and the connecting portions 184 are directly mounted on the frame portion 190 to form one united body. Therefore, the LED assembly 180 has a relatively slim thickness H as compared with the related art LED assembly in which the LEDs are mounted on the printed circuit board. In addition, the LED assembly 180 functions as a linear light source, and the total thickness H of the LED assembly 180 can be controlled by adjusting the thickness of the sealing portion 188.

Figure 4B:
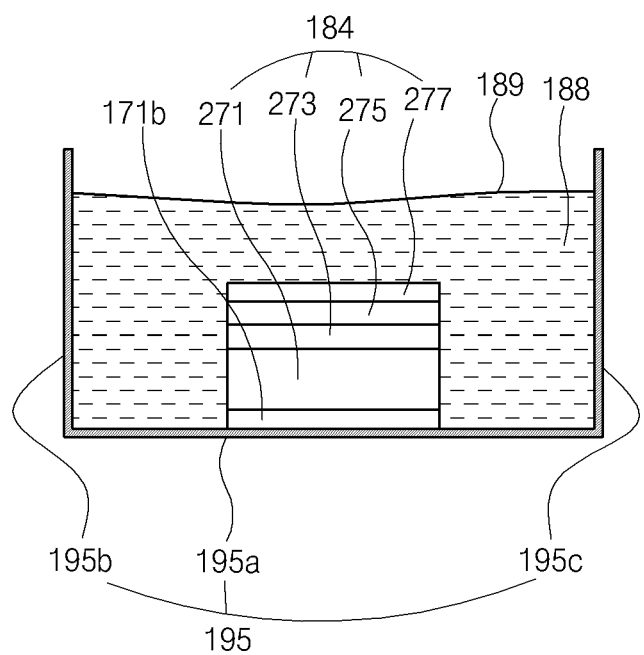
FIG. 4B is a cross-sectional view taken along the line II-II' of FIG. 1.

FIG. 4A is a cross-sectional view taken along the line I-I' of FIG. 1, and FIG. 4B is a cross-sectional view taken along the line II-II' of FIG. 1. The same references will be used for the same parts as those in FIGS. 1 to 3, and explanation for the same parts will be omitted.

In FIG. 4A, the metal part 195, an attaching means 171a, the LED chip 182, and the sealing portion 188 are sequentially disposed from bottom to top.

Here, the metal part 195 makes the LED chip 182 and the sealing portion 188 airtight and protects the LED chip 182 and the sealing portion 188. As mentioned above, the metal part 195 functions as an outer frame, and at the same time, the metal part 195 effectively discharges heat generated from the LED chip 182.

The metal part 195 includes the bottom part 195a on which the LED chip 182 is mounted, and the first and second side parts 195b and 195c which are formed perpendicular to the bottom part 195a and along the length direction of the bottom part 195a and face each other.

At this time, the first and second side parts 195b and 195c of the metal part 195 are higher than the sealing portion 188. However, a height of the first and second side parts 195b and 195c are not limited on this, and the height of the first and second side parts 195b and 195c may be equal to a top surface of the sealing portion 188.

The attaching means 171a is to attach the LED chip 182 to the bottom part 195a of the metal part 195. The attaching means 171a may be paste.

Accordingly, light emitted from the LED chip 182 is outputted through a front surface 189 of the sealing portion 188.

Meanwhile, in FIG. 4B, the metal part 195, an attaching means 171b, the connecting portion 184, and the sealing portion 188 are sequentially disposed from bottom to top.

The attaching means 171b is to attach the connecting portion 184 to the bottom part 195a of the metal part 195. The attaching means 171a may be paste like FIG. 4A.

The connecting portion 184 is a film including a base layer 271, an adhesion means 273, a copper layer 275, and a silver coating layer 277 from bottom to top.

Here, the base layer 271 may support the whole connecting portion 184 and may be formed of polyimide.

The adhesion means 273 is disposed between the base layer 271 and the copper layer 275 and bonds the base layer 271 and the copper layer 275.

The connecting portion 184 having the above-mentioned structure of a film shape may be attached to the metal part 195 with the LED chip 182 in order or simultaneously with the LED chip 182 during an attaching process. More particularly, the attaching process may be a die bonding process. Thus, the LED chips and the connecting portions may be attached to the frame portion through the die bonding process by die bonding apparatus. In the present invention, since the LED chips and the connecting portions are attached to the frame portion during one process, manufacturing processes are simplified, and the productivity and efficiency of the processes are improved.

In the meantime, the connecting portion 184 may be formed as a dummy chip shape using wafer for manufacturing a chip. This will be described with reference to FIG. 5.

Figure 5:
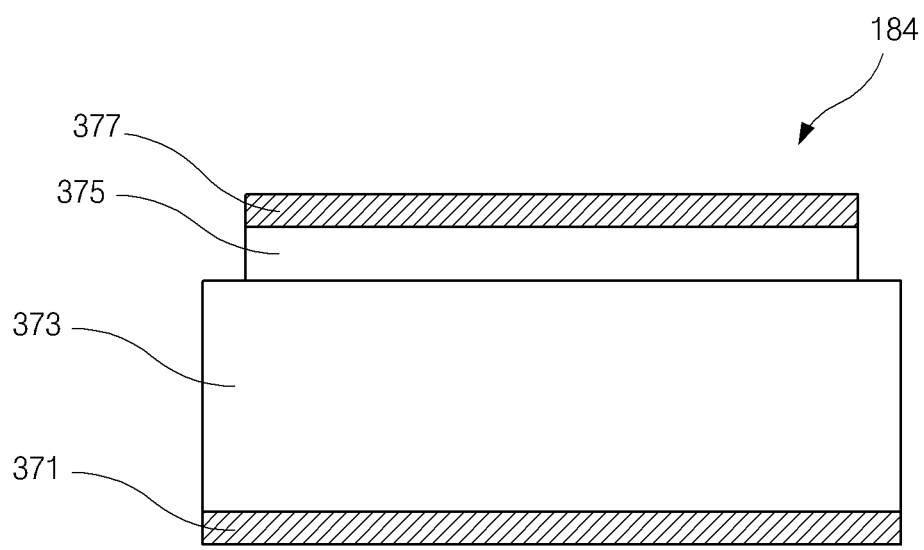
FIG. 5 is a view of illustrating another structure of a connecting portion of FIG. 4B.

FIG. 5 is a view of illustrating another structure of a connecting portion of FIG. 4B.

In FIG. 5, the connecting portion 184 may have a dummy chip shape including a silicon substrate 373, a first electrode layer 371 formed on a rear surface of the silicon substrate 373, and a silicon oxide layer 375 and a second electrode layer 377 sequentially formed on a front surface of the silicon substrate 373.

The connecting portion 184 may be attached to the metal part 195 of FIG. 4B through the attaching means 171b of FIG. 4B.

Figure 6:
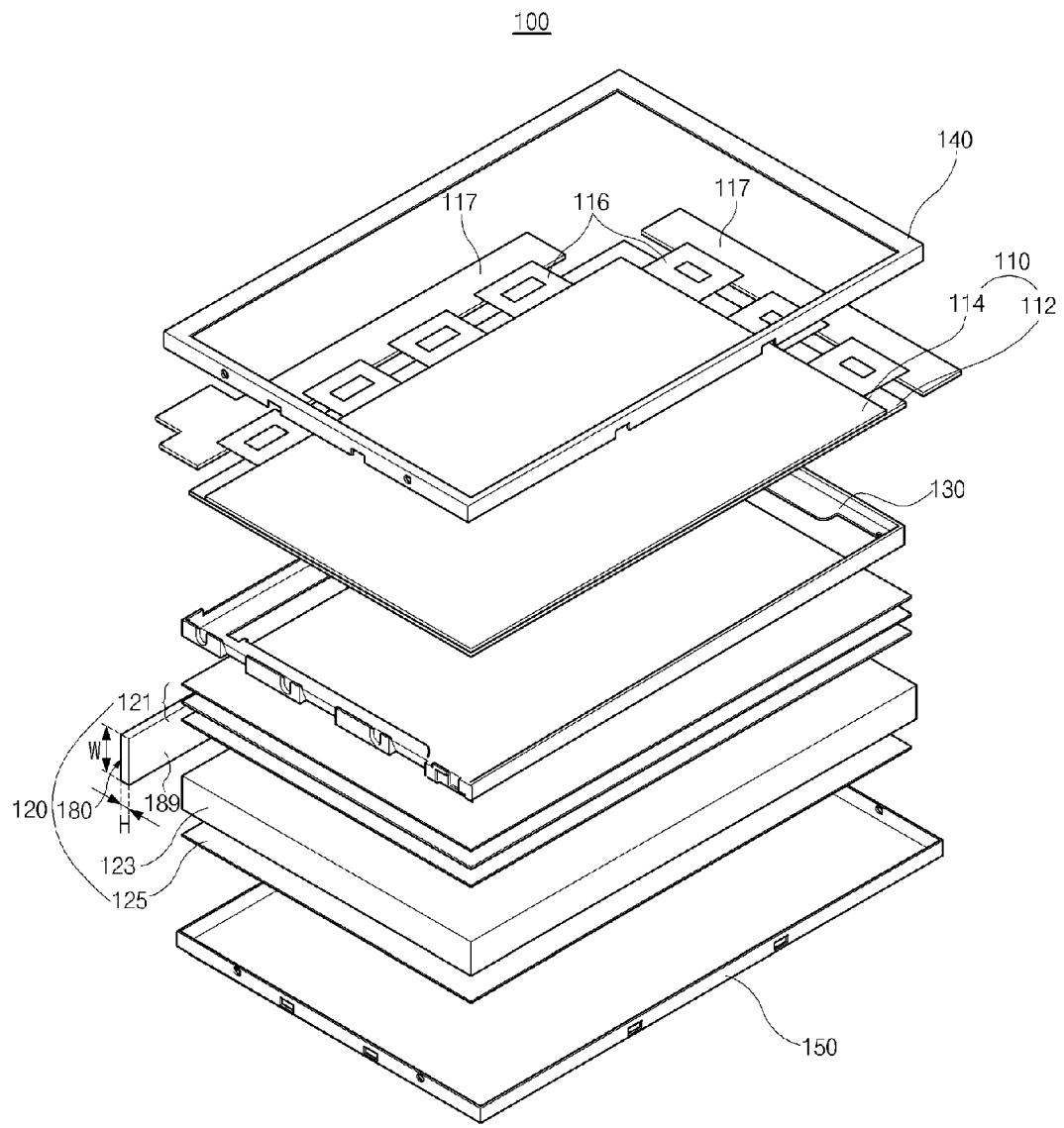
FIG. 6 is an exploded perspective view of illustrating an LCD device including an LED assembly according to an embodiment of the present invention.

FIG. 6 is an exploded perspective view of illustrating a liquid crystal display (LCD) device including an LED assembly according to an embodiment of the present invention. Here, the same reference will be used for the same parts of FIGS. 1 to 5, and explanation for the same parts will be omitted.

In FIG. 6, the LCD device 100 includes a liquid crystal panel 110, a backlight unit 120, a support main 130, a top cover 140 and a cover bottom 150.

More particularly, the liquid crystal panel 110 displays images. The liquid crystal panel 110 includes first and second substrates 112 and 114 facing and attached to each other with a liquid crystal layer placed between the first and second substrates 112 and 114. Although not shown in the figures, in an active matrix-type, gate lines and data lines are formed on an inner surface of the first substrate 112. The first substrate 112 may also be referred to as a lower substrate or an array substrate. The gate lines and the data lines intersect to define pixel regions. A thin film transistor (TFT) is formed at each crossing point of the gate and data lines, and a pixel electrode is connected to the thin film transistor at each pixel region. The pixel electrode may be formed of a transparent conductive material.

A black matrix and red, green and blue color filter patterns are formed on an inner surface of the second substrate 114. The second substrate may be referred to as an upper substrate or a color filter substrate. The color filter patterns correspond to the pixel regions, respectively. The black matrix surrounds each of the color filter patterns and covers the gate lines, the data lines, and/or the thin film transistors. A transparent common electrode is formed over the color filter patterns and the black matrix. Here, the common electrode may be formed over the first substrate 112.

Polarizers (not shown) are attached to outer surfaces of the first and second substrates 112 and 114 and selectively transmit linearly polarized light.

A printed circuit board 117 is attached to at least a side of the liquid crystal panel 110 via connecting means 116 such as flexible printed circuit boards or tape carrier packages (TCPs). The printed circuit board 117 is bent toward a side surface of the support main 130 or a rear surface of the cover bottom 150 during a module assembly process.

In the liquid crystal panel 110, on/off signals from gate driving circuits are provided to the thin film transistors through the gate lines, and when the thin film transistors selected by each gate line turn on, data signals from data driving circuits are provided to the pixel electrodes through the data lines. According to this signal voltage, an electric field is induced between the pixel electrodes and the common electrode, and the arrangement of the liquid crystal molecules is changed by the electric field to thereby change transmittance of light. Therefore, the liquid crystal panel 110 displays variances in the transmittance as images.

The backlight unit 120 is disposed under the liquid crystal panel 110 and provides light to the liquid crystal panel 110 so that the variances in the transmittance of the liquid crystal panel 110 are shown to the outside.

The backlight unit 120 includes a light-emitting diode (LED) assembly 180 disposed along an edge of the support main 130, a reflection sheet 125, a light guide plate 123 over the reflection sheet 125 and with at least one side facing the LED assembly 180, which will be referred to as a light incident surface, and optical sheets 121 over the light guide plate 123.

The LED assembly 180 includes the LED chips 182 of FIG. 1 and the connecting portions 184 of FIG. 1 connecting the LED chips 182, which are mounted on the frame portion 190 of FIG. 1 to form one united body. The LED assembly 180 is bar-shaped and functions as a linear light source.

Light emitted from the LED chips 182 of FIG. 1 of the LED assembly 180 is outputted through the front surface 189 of the sealing portion 188 of FIG. 1 as a linear light source and then is incident on the light guide plate 123 through the light incident surface of the light guide plate 123.

In the LED assembly 180 of the present invention, since the LED chips 182 of FIG. 1 are mounted on the frame portion 190 of FIG. 1 including a metal material and the metal frame 190 is exposed to the atmosphere differently from the related art LED assembly in which the LEDs are mounted on the printed circuit board by soldering, the heat generated from the LED chips 182 of FIG. 1 is promptly discharged to the outside. Therefore, the lifetime of each of the LED chips is lengthened without a heat sink plate, and the brightness is prevented from being changed by the heat, thereby maintaining high brightness.

Moreover, since the LED assembly 180 does not require a printed circuit board including circuit lines, the LED assembly 180 of the present invention may have the thinner thickness H than the related art LED assembly. In addition, the LED assembly 180 of the present invention functions as a linear light source of a bar shape, and the total thickness H of the LED assembly 180 can be controlled by adjusting the thickness of the sealing portion 188 of FIG. 1. If the thickness H of the LED assembly 180 is decreased, a bezel width corresponding to a non-display area is also decreased, and the LCD device has a narrow bezel.

Furthermore, the width W of the LED assembly 180 of the present invention can be controlled by adjusting the size of the connecting portions 184 of FIG. 1. Therefore, the thickness of the light guide plate 123 is also decreased with the width W of the LED assembly 180, and the total thickness of the LCD device of the invention can be decreased, thereby realizing an LCD device with a thin thickness.

The reflection sheet 125 may have a rectangular plate shape and reflect light passing through the rear surface of the light guide plate 123 toward the liquid crystal panel 110, thereby increasing brightness of light.

The light guide plate 123 totally reflects light emitted from the LED assembly 180 several times such that the light moves through the inside of the light guide plate 123 and is uniformly scattered to produce a surface light source. Accordingly, the surface light source is provided to the liquid crystal panel 110.

To provide a uniform surface light source, the light guide plate 123 may include predetermined patterns at its rear surface. Here, to guide the light incident on the inside of the light guide plate 123, the patterns may be elliptical patterns, polygonal patterns or hologram patterns. The patterns may be formed by a printing method or an injecting method.

The light guide plate 123 may be formed of polymethyl methacrylate (PMMA) or polymethacrylstyrene (MS) resin, which is a mixture of polymethyl methacrylate (PMMA) and polystyrene (PS).

The optical sheets 121 over the light guide plate 123 diffuse or concentrate light, which is changed into the surface light source by the light guide plate 123, and provide more uniform surface light source to the liquid crystal panel 110.

The optical sheets 121 may include a diffuser sheet diffusing light, a prism sheet concentrating light, and a protection sheet protecting the prism sheet and additionally diffusing light.

The liquid crystal panel 110 and the backlight unit 120 are combined with the top cover 140, the support main 130 and the cover bottom 150 to form one united body.

The support main 130 surrounds edges of the liquid crystal panel 110 and the backlight unit 120 and separates the liquid crystal panel 110 and the backlight unit 120.

The top cover 140 surrounds edges of a front surface of the liquid crystal panel 110 and has an opening at a front surface of the top cover 140 such that images produced by the liquid crystal panel 110 are displayed through the opening.

The liquid crystal panel 110 and the backlight unit 120 are disposed over the cover bottom 150. The cover bottom 150 is a base for assembling the LCD device 100. The cover bottom 150 includes a bottom wall, on which the backlight unit 120 is disposed and which has a rectangular plate shape, and side walls, which are perpendicularly connected to the bottom wall and cover side surfaces of the support main 130.

Therefore, the edges of the liquid crystal panel 110 and the backlight unit 120 are surrounded by the support main 130 having a rectangular frame shape, the top cover 140 covers the edges of the front surface of the liquid crystal panel 110, and the cover bottom 150 covers the rear surface of the support main 130. The top cover 140 and the cover bottom 150 are combined with the support main 130 to be modularized as one united body.

In the modularized LCD device 100, light emitted from the LED assembly 180 of the backlight unit 120 is incident on the light guide plate 123 through the light incident surface, is refracted by the light guide plate 123 toward the liquid crystal panel 110, and is changed into more uniform and higher quality surface light source with light reflected by the reflection sheet 125 while passing through the optical sheets 121, thereby being provided to the liquid crystal panel 110.

The top cover 140 may also be referred to as a case top or a top case. The support main 130 may also be referred to as a guide panel, a main support or a mold frame. The cover bottom 150 may also be referred to as a bottom cover or a lower cover.

Here, an edge-type backlight unit is explained as an example of the present invention. However, the present invention is not limited on this, and a direct-type backlight unit may be used for the backlight unit including the LED assembly according to the present invention. Accordingly, it is possible to produce an LCD device including a slim direct-type backlight unit.

In the LED assembly of the present invention, the LED chips and the frame portion covering the LED chips are formed as one united body. Thus, the thickness of the LED assembly can be minimized, and the heat generated from the LED chips can be easily discharged into the outside.

Moreover, by using the connecting portions of an island shape between adjacent LED chips, the bonding contact problems are prevented, and sagging of the wires due to separation of the LED chips and electrical shortage are prevented. At this time, since the connecting portions of a film shape or a dummy chip shape are attached to the frame portion with the LED chips during one process, the manufacturing processes are simplified, and the productivity and efficiency of the processes are improved. Manufacturing costs are minimized.

Furthermore, by controlling the size of the connecting portions, the distance between the LED chips are narrowed, and more LED chips are mounted. Therefore, an amount of emitted light is increased, and the light efficiency is improved.

Accordingly, the LCD device including the LED assembly according to the present invention has a thin thickness, a narrow bezel width, and high brightness.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A liquid crystal display device, comprising:
   a liquid crystal panel; and
   a backlight unit disposed under the liquid crystal panel and including an LED assembly,
   wherein the LED assembly includes a frame portion, LED chips arranged in the frame portion in a line and spaced apart from each other, connecting portions each disposed between adjacent LED chips and connected to adjacent LED chips through wire bonding, and a sealing portion including a fluorescent substance and covering the LED chips and the connecting portions, each of the connecting portions including a first electrode layer and a second electrode layer formed on a rear surface and a front surface of a substrate, respectively,
   wherein the sealing portion changes light emitted from the LED chips into a linear light source,
   wherein the LED chips are connected to each other through the connecting portions in series, and
   wherein each of the connecting portions is island-shaped and has a dummy chip structure.

2. The device according to claim 1, wherein the frame portion includes first and second molding parts having electrode pad parts for connection with an external power supply, respectively, and a metal part of a conductive material between the first and second molding parts, and
   wherein the metal part includes a bottom part on which the LED chips and the connecting portions are mounted and a side part which is formed perpendicular to the bottom part along a length direction of the bottom part and covers side walls of the seal portion.

3. The device according to claim 1, wherein the number of the LED chips is one more than the number of the connecting portions.

4. The device according to claim 1, wherein the LED chips and the connecting portions are attached to the frame portion by a die bonding method.

5. The device according to claim 1, wherein the backlight unit is an edge-type in which the LED assembly is disposed at at least a side of a light guide plate under the liquid crystal panel or a direct-type in which LED assemblies are disposed under the liquid crystal panel.

6. An LED assembly, comprising:
   a frame portion;
   LED chips arranged in the frame portion in a line and spaced apart from each other;
   connecting portions each disposed between adjacent LED chips and connected to adjacent LED chips through wire bonding, each of the connecting portions including a first electrode layer and a second electrode layer formed on a rear surface and a front surface of a substrate, respectively; and
   a sealing portion including a fluorescent substance and covering the LED chips and the connecting portions,
   wherein the sealing portion changes light emitted from the LED chips into a linear light source, wherein the LED chips are connected to each other through the connecting portions in series, and wherein each of the connecting portion is island-shaped and has a dummy chip structure.

7. The LED assembly according to claim 6, wherein the LED chips and the connecting portions are attached to the frame portion by a die bonding method.

8. The LED assembly according to claim 6, wherein the frame portion includes first and second molding parts having electrode pad parts for connection with an external power supply, respectively, and a metal part of a conductive material between the first and second molding parts, and wherein the metal part includes a bottom part on which the LED chips and the connecting portions are mounted and a side part which is formed perpendicular to the bottom part along a length direction of the bottom part and covers side walls of the seal portion.

9. The LED assembly according to claim 6, wherein each of the connecting portions includes an insulating layer on which the second electrode is formed.

* * * * *